US010267868B1

(12) United States Patent
Latone et al.

(10) Patent No.: US 10,267,868 B1
(45) Date of Patent: Apr. 23, 2019

(54) IDENTIFYING A LOCATION OF AN AUDIO DEVICE RELATIVE TO A MOBILE DEVICE

(71) Applicant: International Business Machines Corporation, Armonk, NY (US)

(72) Inventors: Joseph A. Latone, San Francisco, CA (US); Brandon Z. Frank, Princeton, NJ (US)

(73) Assignee: International Business Machines Corporation, Armonk, NY (US)

(*) Notice: Subject to any disclaimer, the term of this patent is extended or adjusted under 35 U.S.C. 154(b) by 13 days.

(21) Appl. No.: 15/887,453

(22) Filed: Feb. 2, 2018

(51) Int. Cl.
*G01R 33/00* (2006.01)
*H04R 1/10* (2006.01)
*H04R 9/06* (2006.01)
*G01B 11/14* (2006.01)
*H04R 29/00* (2006.01)
*G01R 33/07* (2006.01)

(52) U.S. Cl.
CPC .......... *G01R 33/0023* (2013.01); *G01B 11/14* (2013.01); *G01R 33/07* (2013.01); *H04R 1/1091* (2013.01); *H04R 9/06* (2013.01); *H04R 29/001* (2013.01)

(58) Field of Classification Search
USPC ....... 381/58, 59, 74, 309, 310; 379/25, 88.2, 379/88.19, 142.1, 207.12
See application file for complete search history.

(56) References Cited

U.S. PATENT DOCUMENTS

| 8,730,048 B2 | 5/2014 | Shen et al. | |
| 2012/0284427 A1* | 11/2012 | Dods | H04W 88/00 710/3 |
| 2015/0169915 A1* | 6/2015 | Petre | G06K 19/0702 340/10.6 |

OTHER PUBLICATIONS

Graham et al., "A Smartphone Compatible SONAR Ranging Attachment for 2D Mapping," vol. 3, No. 5, Nov. 2015, pp. 1-8 retrieved from http://www.cs.wm.edu/.
Zalmai et al., "Gesture Recognition from Magnetic Field Measurements using a Bank of Linear State Space Models and Local Likelihood Filtering," ICASSP, 2015, pp. 1-5 retrieved from http://www.isiweb.ee.ethz.ch/.
Leko, I., "Real-time magnet position detection using smartphone (iPhone)," YouTube, Published Nov. 22, 2014, 1 page, retrieved from https://www.youtube.com/watch?v=fJIgDlO3oL8.
Beldar, M., "Magnetometer sensor of android mobile can do more than you think [External Magnetic Wireless Input]," YouTube, published Apr. 11, 2015, 1 page, retrieved from https://www.youtube.com/watch?v=dAljjFYYOa0.
Blackmon, F., "What Is a Magnetometer?" retrieved from WayBackMachine, Oct. 2015, 3 pages, http://www.ehow.com/about_5397128_magnetometer.html.
Audio Bone, "Ear-Free Listening," retrieved from WayBackMachine, Oct. 2016, 2 pages, http://www.audioboneheadphones.com.
Adafruit, "Bone Conductor Transducer Wires—8 Ohm 1," retrieved from WayBackMachine, Oct. 2016, 4 pages, https://www.adafruit.com/product/1674.

* cited by examiner

*Primary Examiner* — Yosef K Laekemariam

(74) *Attorney, Agent, or Firm* — Zilka-Kotab, P.C.

(57) ABSTRACT

A computer-implemented method according to one embodiment includes receiving, at a mobile device, a magnetic field produced by an audio device, determining, by the mobile device, a location of the audio device relative to the mobile device, utilizing the magnetic field, and performing, by the mobile device, one or more operations, utilizing the location of the audio device relative to the mobile device.

16 Claims, 5 Drawing Sheets

IDENTIFYING A LOCATION OF AN AUDIO DEVICE RELATIVE TO A MOBILE DEVICE

BACKGROUND

The present invention relates to location tracking, and more specifically, this invention relates to identifying a location of an audio device by measuring a magnetic field produced by the audio device.

Headphones and/or earphones are a common accessory to mobile devices. For example, many mobile devices have a means to connect headphones and/or earphones to the mobile device so that a user can listen to audio produced by the device. However, headphones and/or earphones are currently utilized solely for the listening enjoyment of the user, and do not provide any additional functionality.

SUMMARY

A computer-implemented method according to one embodiment includes receiving, at a mobile device, a magnetic field produced by an audio device, determining, by the mobile device, a location of the audio device relative to the mobile device, utilizing the magnetic field, and performing, by the mobile device, one or more operations, utilizing the location of the audio device relative to the mobile device.

According to another embodiment, a computer program product for identifying a location of an audio device relative to a mobile device comprises a computer readable storage medium having program instructions embodied therewith, wherein the computer readable storage medium is not a transitory signal per se, and where the program instructions are executable by a processor to cause the processor to perform a method comprising receiving, at the mobile device, a magnetic field produced by the audio device, utilizing the processor, determining, by the mobile device, the location of the audio device relative to the mobile device, utilizing the magnetic field, utilizing the processor, and performing, by the mobile device, one or more operations, utilizing the location of the audio device relative to the mobile device, utilizing the processor.

A system according to another embodiment includes a processor, and logic integrated with the processor, executable by the processor, or integrated with and executable by the processor, where the logic is configured to receive, at a mobile device, a magnetic field produced by an audio device, determine, by the mobile device, a location of the audio device relative to the mobile device, utilizing the magnetic field, and perform, by the mobile device, one or more operations, utilizing the location of the audio device relative to the mobile device.

Other aspects and embodiments of the present invention will become apparent from the following detailed description, which, when taken in conjunction with the drawings, illustrate by way of example the principles of the invention.

DETAILED DESCRIPTION

Figure 1:
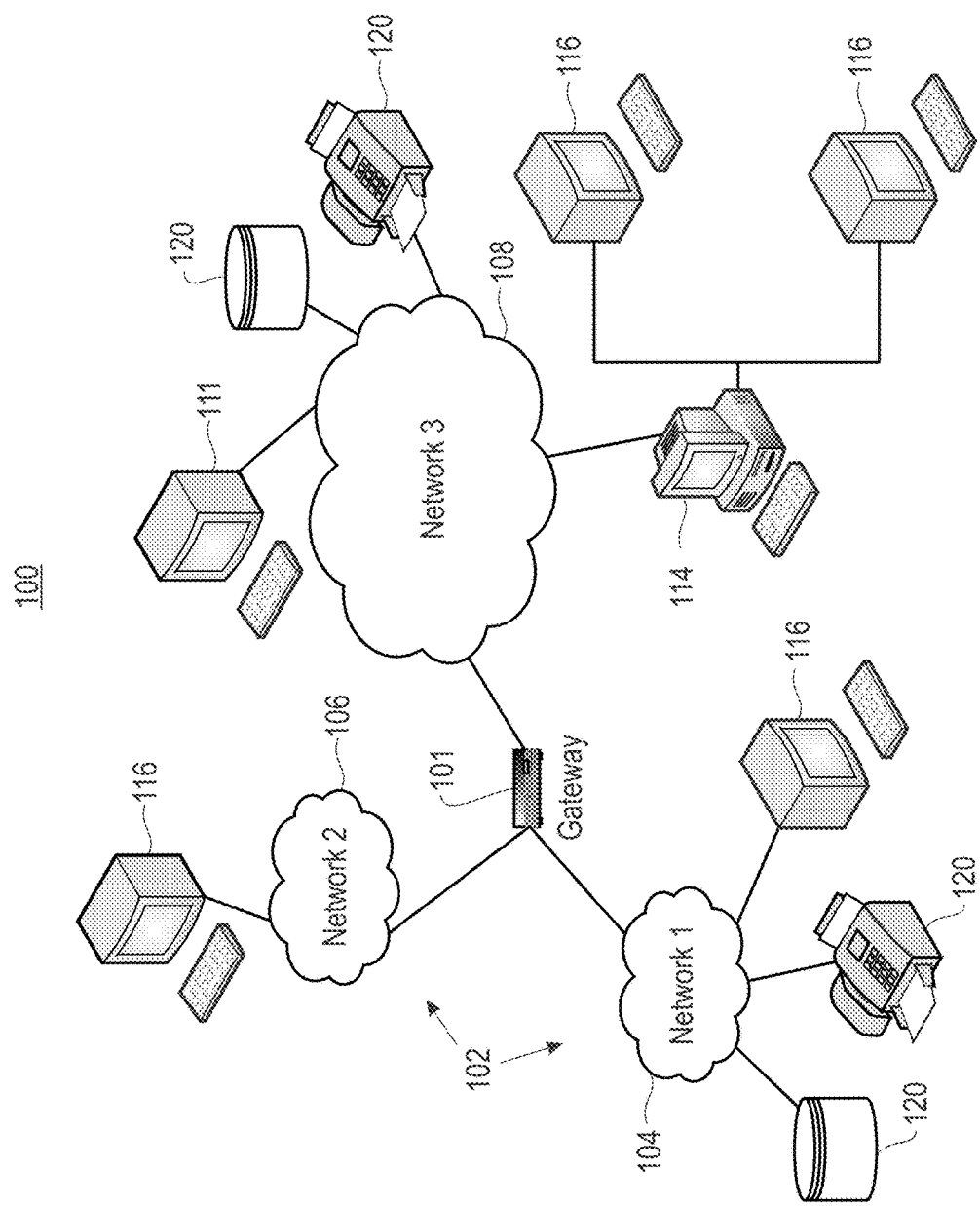
FIG. 1 illustrates a network architecture, in accordance with one embodiment.

The following description discloses several preferred embodiments of systems, methods and computer program products for identifying a location of an audio device relative to a mobile device. Various embodiments provide a method to detect at the mobile device a magnetic field produced by the audio device, and use the magnetic field to determine the location of the audio device relative to the mobile device.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for identifying a location of an audio device relative to a mobile device.

In one general embodiment, a computer-implemented method includes receiving, at a mobile device, a magnetic field produced by an audio device, determining, by the mobile device, a location of the audio device relative to the mobile device, utilizing the magnetic field, and performing, by the mobile device, one or more operations, utilizing the location of the audio device relative to the mobile device.

In another general embodiment, a computer program product for identifying a location of an audio device relative to a mobile device comprises a computer readable storage medium having program instructions embodied therewith, wherein the computer readable storage medium is not a transitory signal per se, and where the program instructions are executable by a processor to cause the processor to perform a method comprising receiving, at the mobile device, a magnetic field produced by the audio device, utilizing the processor, determining, by the mobile device, the location of the audio device relative to the mobile device, utilizing the magnetic field, utilizing the processor, and performing, by the mobile device, one or more operations, utilizing the location of the audio device relative to the mobile device, utilizing the processor.

In another general embodiment, a system includes a processor, and logic integrated with the processor, executable by the processor, or integrated with and executable by the processor, where the logic is configured to receive, at a mobile device, a magnetic field produced by an audio device, determine, by the mobile device, a location of the audio device relative to the mobile device, utilizing the magnetic field, and perform, by the mobile device, one or more operations, utilizing the location of the audio device relative to the mobile device.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
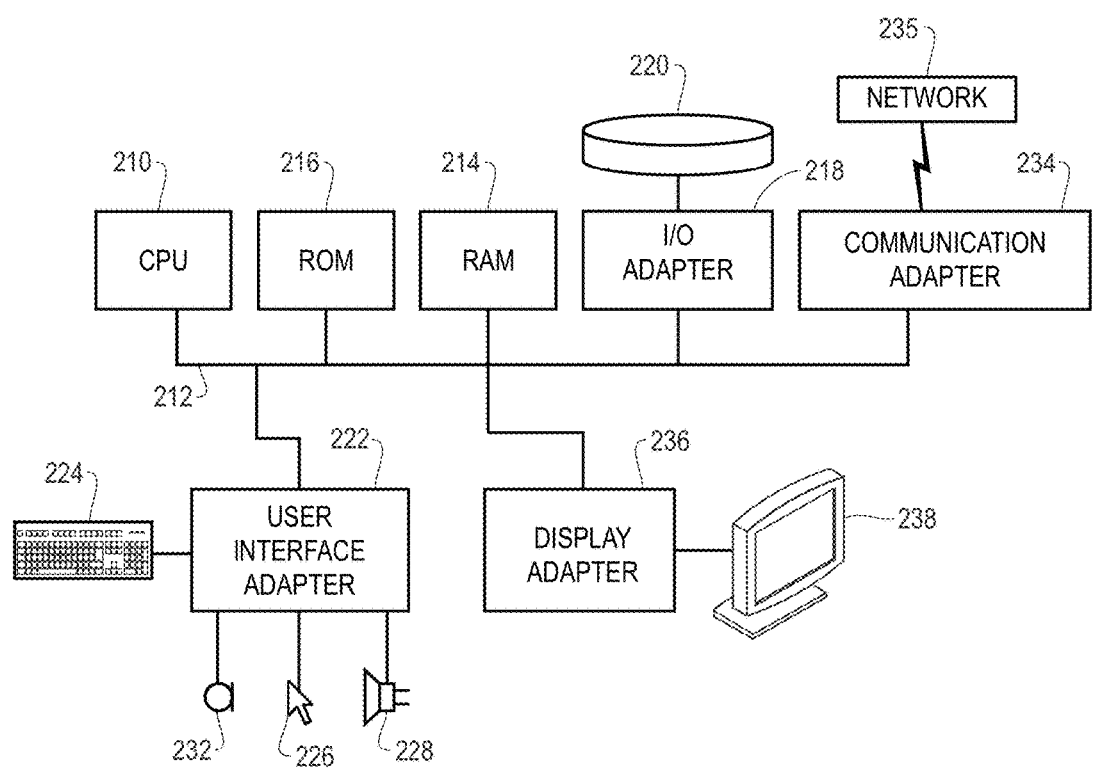
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using XML, C, and/or C++ language, or other programming languages, along with an object oriented programming methodology. Object oriented programming (OOP), which has become increasingly used to develop complex applications, may be used.

Figure 3:
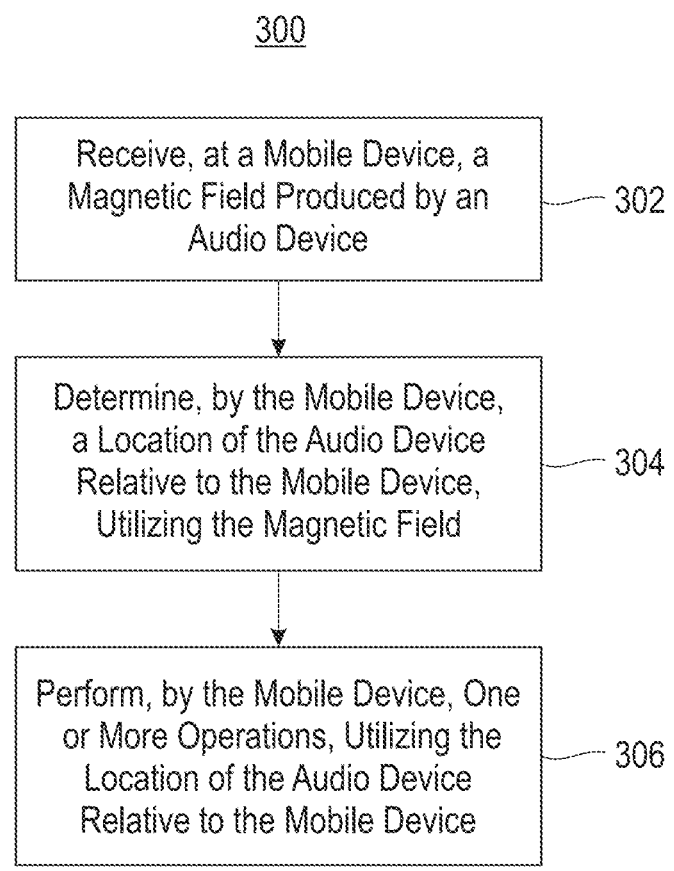
FIG. 3 illustrates a method for identifying a location of an audio device relative to a mobile device, in accordance with one embodiment.

Now referring to FIG. 3, a flowchart of a method 300 is shown according to one embodiment. The method 300 may be performed in accordance with the present invention in any of the environments depicted in FIGS. 1-2 and 5, among others, in various embodiments. Of course, more or less operations than those specifically described in FIG. 3 may be included in method 300, as would be understood by one of skill in the art upon reading the present descriptions.

Each of the steps of the method 300 may be performed by any suitable component of the operating environment. For example, in various embodiments, the method 300 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 300. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 3, method 300 may initiate with operation 302, where a magnetic field produced by an audio device is received at a mobile device. In one embodiment, the mobile device may include a mobile computing device (e.g., a cellular telephone, a laptop computer, a tablet computer, a wearable computing device, etc.). In another embodiment, the audio device may include a listening device (e.g., a speaker, etc.) worn on, around, or in one or more ears of a user.

For example, the audio device may include one or more electroacoustic transducers that convert an electric signal to a corresponding sound. In another example, the audio device may include one or more earbuds or earphones (e.g., that are designed to be inserted at least partially into a user's ear canal, etc.). In yet another example, the audio device may include one or more circumaural or supra-aural headphones that are held in place over one or more ears of the user using one or more bands. In still another embodiment, the audio device may include a hearing aid. In another embodiment, the audio device may include one or more bone-conduction earphones (e.g., earphones that include a metal rod wrapped with a voice coil, where the metal rod expands and contracts when current is pulsed through the voice coil, etc.).

Additionally, in one embodiment, the audio device may include one or more rare-earth magnets. In another embodiment, the audio device may include one or more electromagnetic voice coils. In yet another embodiment, the audio device may include one or more speaker cones. In still another embodiment, the audio device may produce one or more magnetic fields by emitting one or more tones. For example, the tones may be audible or inaudible. In another example, the audio device may emit a unique sequence of tonality changes from a speaker cone of the audio device.

Further, in one embodiment, the audio device may emit one or more tones in response to one or more signals sent by the mobile device. For example, the mobile device may send one or more fluctuating electric signals to the audio device that are converted into the one or more tones. In another example, the magnetic field may include a fluctuating magnetic field. For example, the receipt of the one or more electric signals may prompt an electromagnetic voice coil of the audio device to emit a fluctuating magnetic field, where this fluctuating magnetic field may be different from other magnetic fields produced by the audio device (and may be generated by the electromagnetic voice coil regardless of whether the audio device is plugged into the mobile device). For instance, the audio device may produce another magnetic field from a rare-earth magnet of the audio device, static electricity passing through one or more coils of the audio device, etc.

Further still, in one embodiment, the audio device may be connected to the mobile device via one or more wires. In another embodiment, the audio device may be connected wirelessly to the mobile device, utilizing one or more communication protocols (e.g., Bluetooth™, etc.). In yet another embodiment, the audio device may emit one or more tones in response to one or more signals sent by a second mobile device other than the mobile device whose magnetometer is reading the field.

Additionally, in one embodiment, the magnetic field may be received utilizing one or more magnetometers of one or more mobile devices. For example, the magnetometer may measure a strength and/or direction of a magnetic field at a point in space. In another example, a plurality of magnetometers of one or more mobile devices may triangulate the magnetic field. In yet another example, the magnetometer may include a coil, where the magnetometer detects a magnetic field when the magnetic field induces a charge in the coil. For instance, using the magnetometer, a mobile device may record/save historical positioning data that was derived from the changes in the magnetic field.

Also, as shown in FIG. 3, method 300 may proceed with operation 304, where a location of the audio device relative to the mobile device is determined by the mobile device, utilizing the magnetic field. In one embodiment, the magnetic field produced by the audio device may disturb a flow of current through the coil. For example, this disturbance may indicate the presence of the magnetic field to the magnetometer (e.g., utilizing the Hall Effect, etc.).

In addition, in one embodiment, determining the location of the audio device may include measuring an interruption of flowing current within the coil of the magnetometer, and modeling the location of the audio device from the interruption measurement. In another embodiment, a direction in which the mobile device is currently positioned may be accounted for when determining the location of the audio device. For example, a north, south, east, west (NSEW) direction may be determined for a current position of the mobile device, and may be used when determining the location of the audio device. In yet another embodiment, determining the location may be performed in real-time without calibration.

Furthermore, as shown in FIG. 3, method 300 may proceed with operation 306, where one or more operations are performed by the mobile device, utilizing the location of the audio device relative to the mobile device. In one embodiment, performing the one or more operations may include recording one or more of two dimensional (2D) and three dimensional (3D) paths indicating the location of the audio device relative to the mobile device. In another embodiment, performing the one or more operations may include sending the 2D/3D paths to one or more applications within the mobile device.

Further still, in one embodiment, the location may be used for control of one or more aspects of one or more applications running on the mobile device. For example, changes in the location of the audio device over time relative to the mobile device may be interpreted by an application and may be used as input to the application. In another example, the changes may be used to send one or more control signals to control movement within a game application, adjust one or more application settings within the mobile device, draft and/or send one or more messages utilizing a messaging application of the mobile device, complete a CAPTCHA, etc.

In this way, live spatial tracking of the audio device's proximity to the mobile device may be performed using one or more magnetic fields produced from audible or inaudible waves produced by the audio device in order to determine relative positioning in a grid (e.g., a polar coordinate system, a Cartesian coordinate system, etc.) originating from the one or more magnetometers of the mobile device.

Figure 4:
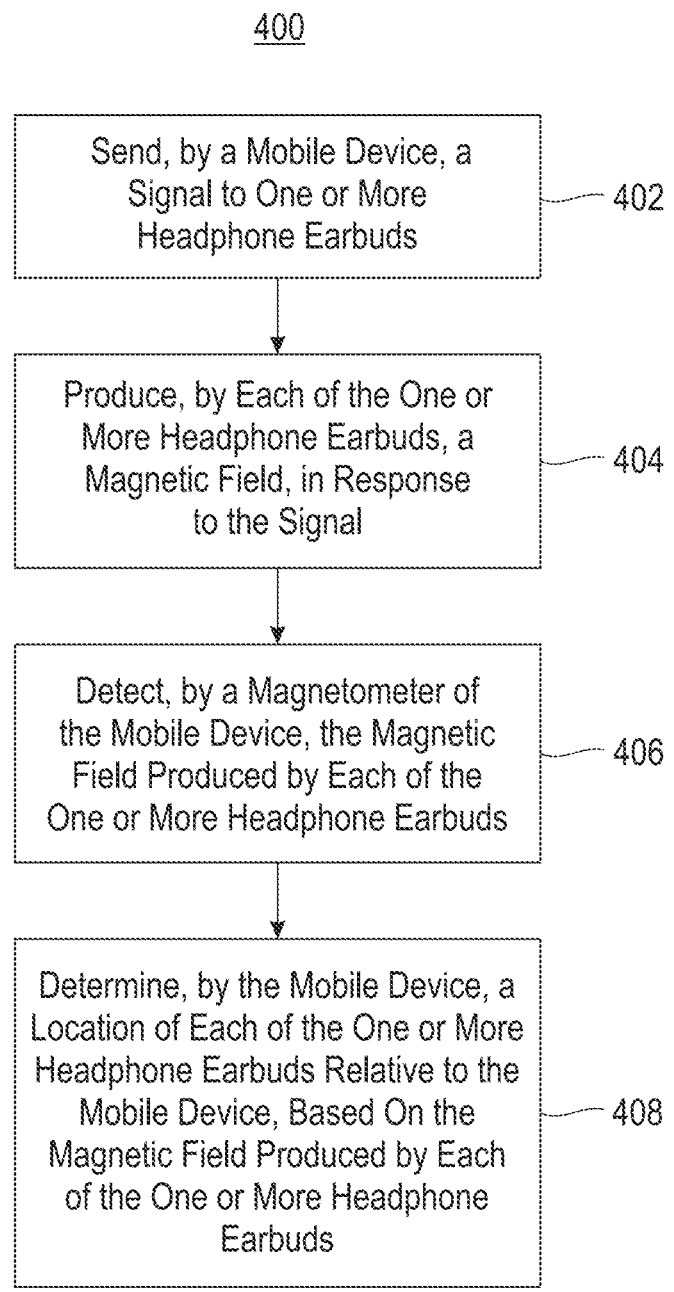
FIG. 4 illustrates a method for determining a location of one or more headphone earbuds relative to a mobile device, in accordance with one embodiment.

Now referring to FIG. 4, a flowchart of a method 400 for determining a location of one or more headphone earbuds relative to a mobile device is shown according to one embodiment. The method 400 may be performed in accordance with the present invention in any of the environments depicted in FIGS. 1-2 and 5, among others, in various embodiments. Of course, more or less operations than those specifically described in FIG. 4 may be included in method 400, as would be understood by one of skill in the art upon reading the present descriptions.

Each of the steps of the method 400 may be performed by any suitable component of the operating environment. For example, in various embodiments, the method 400 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 4, method 400 may initiate with operation 402, where a mobile device sends a signal to one or more headphone earbuds. In one embodiment, the signal may include a tone to be outputted by the one or more headphone earbuds. In another embodiment, the mobile device may send a first tone to a first headphone earbud of a plurality of earbuds, a second tone to a second headphone earbud of the plurality of earbuds, and an Nth tone to an Nth headphone earbud of the plurality of earbuds, where each tone is different from the other tones. For example, a single mobile device may send a unique signal to each of a group of users having earbuds connected to the single mobile device, where each of the group of users are participating in the same event (e.g., watching a video, movie, etc.). In yet another embodiment, the tone to be output may be audible or inaudible.

In still another embodiment, a signal representative of an audible tone may be sent to a first headphone earbud, and a signal representative of a different audible or inaudible tone may be sent to a second headphone earbud. In this way, the first headphone earbud may output audio (e.g., as part of a music or gaming application, etc.), and the second headphone earbud may output audible or inaudible tones used for tracking a location of the second headphone earbud (e.g., in order to control one or more aspects of one or more applications on the mobile device, etc.).

Additionally, as shown in FIG. 4, method 400 may proceed with operation 404, where each of the one or more headphone earbuds produces a magnetic field, in response to the signal. In one embodiment, each of the one or more headphone earbuds may produce a fluctuating magnetic field utilizing an electromagnetic voice coil of the headphone earbud. In another example, sound waves may be generated when the electromagnetic voice coil oscillates (e.g., repels and attracts) relative to the fixed rare-earth magnet. In another embodiment, when outside the frequency range of 20 hz to 20 khz, the sound output by the earbuds may be inaudible to humans but may still produce a magnetic field that can be measured.

Further, as shown in FIG. 4, method 400 may proceed with operation 406, where a magnetometer of the mobile device detects the magnetic field produced by each of the one or more headphone earbuds. In one embodiment, the magnetic field from a rare-earth magnet may always be present and may be used to alter the magnetometer's reading. In another embodiment, using a magnetometer, a mobile device may be able to record/save historical positioning data derived from changes in a magnetic field when it induces a charge in the magnetometer's coil. In yet another embodiment, the magnetometer of the mobile device may detect an interaction between a plurality of different magnetic fields produced by a plurality of headphone earbuds. For example, a detected interference between a plurality of different magnetic fields produced by a plurality of headphone earbuds may be detected and used as input for one or more applications (e.g., authentication applications such as a CAPTCHA where the application attempts to determine whether a pair of headphones/earphones is connected to the mobile device, etc.). In another example, a CAPTCHA application may present a 2D or 3D pattern, and may request that the path be replicated using the one or more headphone earbuds.

In one exemplary embodiment, the introduction of one or more magnetic fields, such as that from the headphone earbud's rare-earth magnet and/or voice coil, may disturb the flow of current through the magnetometer's wire, and may therefore indicate the presence of the field (this is known as the Hall Effect). This interruption of the flowing current may be measurable by the magnetometer, and a relative position of each of the headphone earbuds to the mobile device may be modeled from it. Of course, however, the magnetometer may measure in any manner a strength and/or direction of a magnetic field at a point in space.

In another embodiment, the utilization of the electromagnetic field from headphone earbuds may eliminate a need for calibration when looking to derive a relative position of the one or more headphone earbuds to the mobile device in real time. For example, systems performing precise location tracking of earbuds may require calibration in order to determine accurate positioning of the earbuds.

Further still, as shown in FIG. 4, method 400 may proceed with operation 408, where the mobile device determines a location of each of the one or more headphone earbuds relative to the mobile device, based on the magnetic field produced by each of the one or more headphone earbuds. In one embodiment, once a relative position of each headphone earbud is established, one or more of 2D planar and 3D paths may be tracked for each headphone earbud over time, which may then be used in various applications.

Also, in one embodiment, historical positioning data may be determined for each of the one or more headphone earbuds. In another embodiment, this historical positioning data may be converted to paths made over a given period of time by logging the path of travel of each of the one or more headphone earbuds.

Figure 5:
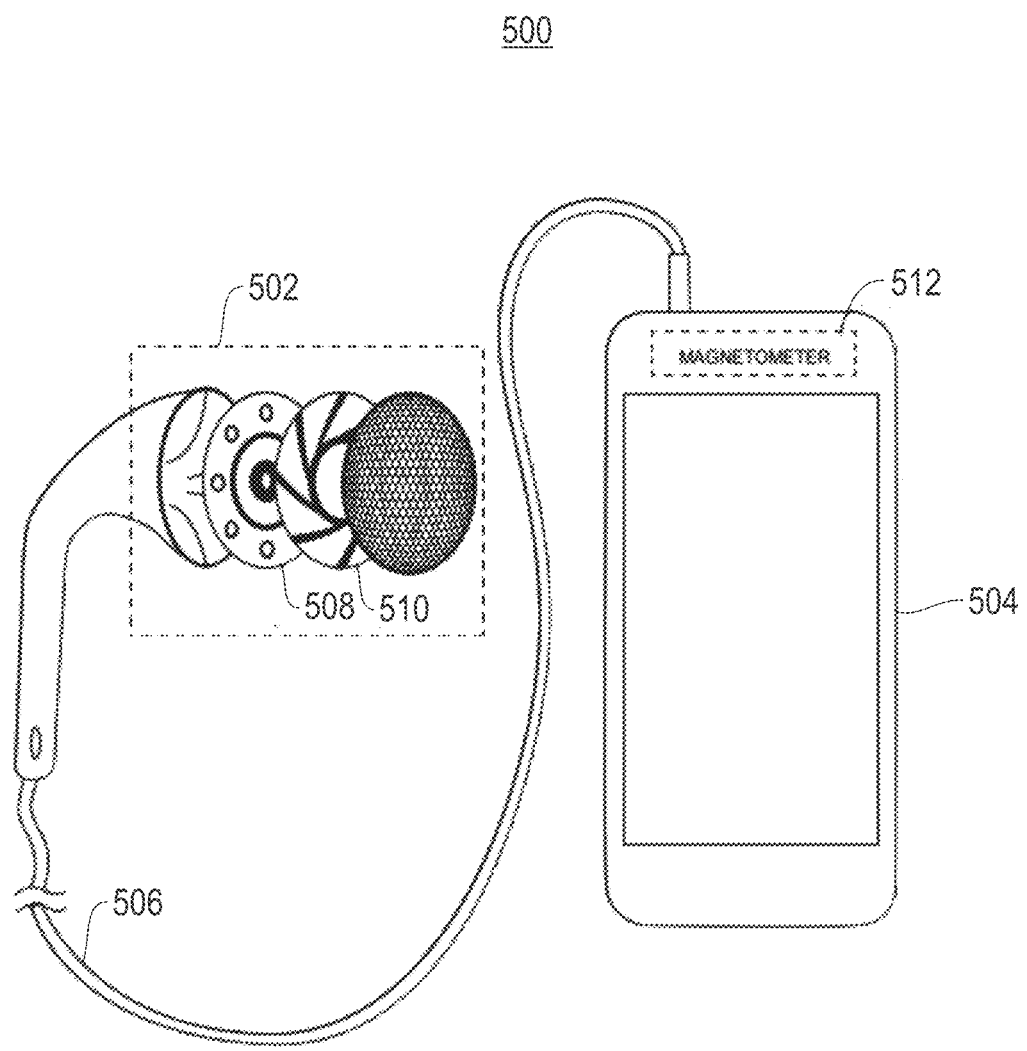
FIG. 5 illustrates an exemplary headphone earbud tracking implementation, in accordance with one embodiment.

FIG. 5 illustrates an exemplary headphone earbud tracking implementation 500, according to one embodiment. As shown, a headphone earbud 502 is physically connected to a mobile device 504 utilizing a wired connection 506. In one embodiment, a wireless connection may be used to connect the headphone earbud 502 and the mobile device 504. Additionally, the headphone earbud 502 includes a rare-earth magnet 508 and an electromagnetic voice coil 510. The mobile device 504 includes a magnetometer 512.

Additionally, in one embodiment, the mobile device 504 may send an electric signal to the headphone earbud 502, utilizing the wired connection 506. In response to receiving the electric signal, the electromagnetic voice coil 510 may oscillate relative to the fixed rare-earth magnet 508, thereby producing one or more sounds. These sounds may be audible to humans or inaudible to humans.

Further, in one embodiment, as the electromagnetic voice coil 510 oscillates relative to the fixed rare-earth magnet 508, the electromagnetic voice coil 510 may produce a fluctuating magnetic field. In another embodiment, this fluctuating magnetic field may be different from a constant, static magnetic field produced by the rare-earth magnet 508, magnetic field fluctuations created by the electromagnetic voice coil 510 due to static charge during unpowered operation (e.g., when not connected to the mobile device 504), etc. In yet another embodiment, the magnetic field produced by the electromagnetic voice coil 510 may fluctuate as a result of a signal frequency change induced through the electromagnetic voice coil 510.

Further still, in one embodiment, the fluctuating magnetic field produced by the electromagnetic voice coil 510 may disturb a flow of current through a coil of the magnetometer 512 of the mobile device 504. In another embodiment, the magnetometer 512 may measure a magnitude and/or a direction of the disturbance, and the mobile device 504 may model a position of the headphone earbud 502 relative to the mobile device 504, based on a measured position vector. In yet another embodiment, the position of the headphone earbud 502 relative to the mobile device 504 may be determined in a grid (e.g., a polar coordinate system, a Cartesian coordinate system, etc).

In another embodiment, changes in the amplitude and/or frequency of audio produced by the earbud 502 may be monitored by the mobile device 504. These changes in amplitude and/or frequency may be used by the mobile device 504 to determine a distance between the mobile device 504 and the earbud 502 (e.g., according to a travel time of audio from the earbud 502 to the mobile device 504, etc.). This distance may be used for calibration, to verify the readings by the magnetometer 512, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
   sending a first signal representative of an audible tone from a mobile device to a first headphone earbud;
   sending a second signal representative of an inaudible tone from the mobile device to a second headphone earbud;
   receiving, at a mobile device, a magnetic field produced by the second headphone earbud;
   determining, by the mobile device, a location of the second headphone earbud relative to the mobile device, utilizing the magnetic field, including:
      tracking and recording, by the mobile device, a three-dimensional path of the second headphone earbud relative to the mobile device; and
   sending the three-dimensional path of the second headphone earbud to a CAPTCHA authentication application running on the mobile device, where the three-dimensional path of the second headphone earbud is used as input to complete the CAPTCHA authentication application.

2. The computer-implemented method of claim 1, further comprising:
   determining changes in amplitude and frequency of audio produced by the second headphone earbud; and
   determining a distance between the mobile device and the second headphone earbud, according to a travel time of the audio from the second headphone earbud to the mobile device.

3. The computer-implemented method of claim 1, wherein the second headphone earbud includes one or more voice coils.

4. The computer-implemented method of claim 1, further comprising utilizing a plurality of magnetometers of the mobile device to triangulate the magnetic field produced by the second headphone earbud.

5. The computer-implemented method of claim 1, wherein the magnetic field is received utilizing a plurality of magnetometers of the mobile device.

6. The computer-implemented method of claim 5, wherein determining the location of the second headphone earbud relative to the mobile device includes measuring an interruption of flowing current within a coil of the plurality of magnetometers, and modeling the location of the second headphone earbud relative to the mobile device from the interruption.

7. The computer-implemented method of claim 1, wherein the magnetic field includes a fluctuating magnetic field.

8. The computer-implemented method of claim 7, wherein a receipt of one or more fluctuating electric signals prompts an electromagnetic voice coil of the second headphone earbud to produce the fluctuating magnetic field.

9. A computer program product for identifying a location of an audio device relative to a mobile device, the computer program product comprising a computer readable storage medium having program instructions embodied therewith, wherein the computer readable storage medium is not a transitory signal per se, the program instructions executable by a processor to cause the processor to perform a method comprising:
   sending a first signal representative of an audible tone from a mobile device to a first headphone earbud, utilizing the processor;
   sending a second signal representative of an inaudible tone from the mobile device to a second headphone earbud, utilizing the processor;
   receiving, at the mobile device, a magnetic field produced by the second headphone earbud, utilizing the processor;
   determining, by the mobile device, the location of the second headphone earbud relative to the mobile device, utilizing the magnetic field, utilizing the processor, including:
      tracking and recording, by the mobile device, a three-dimensional path of the second headphone earbud relative to the mobile device, utilizing the processor; and
   sending the three-dimensional path of the second headphone earbud to a CAPTCHA authentication application running on the mobile device, where the three-dimensional path of the second headphone earbud is used as input to complete the CAPTCHA authentication application, utilizing the processor.

10. The computer program product of claim 9, further comprising:
   determining changes in amplitude and frequency of audio produced by the second headphone earbud, utilizing the processor; and
   determining a distance between the mobile device and the second headphone earbud, according to a travel time of the audio from the second headphone earbud to the mobile device, utilizing the processor.

11. The computer program product of claim 9, wherein the second headphone earbud includes one or more voice coils.

12. The computer program product of claim 9, further comprising utilizing the processor and a plurality of magnetometers of the mobile device to triangulate the magnetic field produced by the second headphone earbud.

13. The computer program product of claim 9, wherein the magnetic field is received utilizing a plurality of magnetometers of the mobile device.

14. The computer program product of claim 13, wherein determining the location of the second headphone earbud relative to the mobile device includes measuring an interruption of flowing current within a coil of the plurality of magnetometers, and modeling the location of the second headphone earbud relative to the mobile device from the interruption, utilizing the processor.

15. The computer program product of claim 9, wherein the magnetic field includes a fluctuating magnetic field.

16. A system, comprising:
   a processor; and
   logic integrated with the processor, executable by the processor, or integrated with and executable by the processor, the logic being configured to:
   send a first signal representative of an audible tone from a mobile device to a first headphone earbud;
   send a second signal representative of an inaudible tone from the mobile device to a second headphone earbud;
   receive, at a mobile device, a magnetic field produced by the second headphone earbud;
   determine, by the mobile device, a location of the second headphone earbud relative to the mobile device, utilizing the magnetic field, including:
      tracking and recording, by the mobile device, a three-dimensional path of the second headphone earbud relative to the mobile device; and
   send the three-dimensional path of the second headphone earbud to a CAPTCHA authentication application running on the mobile device, where the three-dimensional path of the second headphone earbud is used as input to complete the CAPTCHA authentication application.

\* \* \* \* \*